US012768870B2

(12) United States Patent
Penttonen et al.

(10) Patent No.: US 12,768,870 B2
(45) Date of Patent: Oct. 20, 2026

(54) METHOD AND APPARATUS FOR FAULT DETECTION IN DISTRIBUTION GRID

(71) Applicant: Safegrid Oy, Espoo (FI)

(72) Inventors: Jyrki Penttonen, Espoo (FI); Jussi Hakunti, Turku (FI)

(73) Assignee: Safegrid Oy, Espoo (FI)

( * ) Notice: Subject to any disclaimer, the term of this patent is extended or adjusted under 35 U.S.C. 154(b) by 151 days.

(21) Appl. No.: 18/833,451

(22) PCT Filed: Jan. 27, 2023

(86) PCT No.: PCT/FI2023/050056
§ 371 (c)(1),
(2) Date: Jul. 26, 2024

(87) PCT Pub. No.: WO2023/152424
PCT Pub. Date: Aug. 17, 2023

(65) Prior Publication Data
US 2025/0138075 A1 May 1, 2025

(30) Foreign Application Priority Data
Feb. 11, 2022 (FI) ..................................... 20225120

(51) Int. Cl.
*G01R 31/08* (2020.01)
*G01R 15/18* (2006.01)
(Continued)

(52) U.S. Cl.
CPC ......... *G01R 31/085* (2013.01); *G01R 15/181* (2013.01); *G01R 19/0007* (2013.01);
(Continued)

(58) Field of Classification Search
CPC ...... G01R 31/085; G01R 31/58; G01R 31/52; G01R 15/181; G01R 19/0007;
(Continued)

(56) References Cited

U.S. PATENT DOCUMENTS

2006/0012374 A1* 1/2006 Kojovic ............... G01R 31/085 324/522
2012/0001645 A1 1/2012 Javora et al.
(Continued)

FOREIGN PATENT DOCUMENTS

CN 112684370 A 4/2021
EP 2741389 A1 6/2014
(Continued)

OTHER PUBLICATIONS

European Patent Office, The International Search Report and Written Opinion of the International Searching Authority, Application No. PCT/FI2023/050056, mailed Apr. 6, 2023, 15 pages.
Finnish Patent and Registration Office, Search Report, Application No. 20225120, dated Oct. 7, 2022, 2 pages.

*Primary Examiner* — Huy Q Phan
*Assistant Examiner* — Trung Q Nguyen
(74) *Attorney, Agent, or Firm* — Ziegler IP Law Group, LLC.

(57) ABSTRACT

A method of measuring current for fault detection in a distribution grid. The method includes: using three current transformers, wherein three current transformers are connected to one another; installing three connected current transformers in series on three phase conductors by winding; measuring voltages of three series connected current transformers by measuring first voltage over first current transformer, measuring second voltage over first current transformer and second current transformer, measuring third voltage over first current transformer, second current transformer and third current transformer; using measured first voltage, second voltage and third voltage for determining sum current; using measured first voltage, second voltage, third voltage and calculated sum current for calculating phase currents; using determined sum current and phase currents to detect first fault transient in the distribution grid.

11 Claims, 7 Drawing Sheets

(51) Int. Cl.

| | |
|---|---|
| ***G01R 19/00*** | (2006.01) |
| ***G01R 19/10*** | (2006.01) |
| ***G01R 31/52*** | (2020.01) |
| ***G01R 31/58*** | (2020.01) |
| ***H02H 1/00*** | (2006.01) |
| ***H02H 3/16*** | (2006.01) |
| ***H02H 3/32*** | (2006.01) |
| ***H02J 3/001*** | (2026.01) |

(52) U.S. Cl.
CPC ......... *G01R 19/0092* (2013.01); *G01R 19/10* (2013.01); *G01R 31/52* (2020.01); *G01R 31/58* (2020.01); *H02H 1/0007* (2013.01); *H02H 3/165* (2013.01); *H02H 3/32* (2013.01); *H02J 3/00125* (2020.01)

(58) Field of Classification Search
CPC . G01R 19/0092; G01R 19/10; H02J 3/00125; H02H 1/0007; H02H 3/165; H02H 3/32
USPC .............................. 324/500, 600, 76.11, 522
See application file for complete search history.

(56) References Cited

U.S. PATENT DOCUMENTS

| | | | | |
|---|---|---|---|---|
| 2014/0168830 | A1* | 6/2014 | Vangool | H02H 3/338 361/47 |
| 2014/0362486 | A1* | 12/2014 | O'Regan | H01R 13/71 361/87 |
| 2017/0227594 | A1* | 8/2017 | Zhang | H02H 7/045 |
| 2018/0145505 | A1 | 5/2018 | Li et al. | |
| 2020/0241064 | A1* | 7/2020 | Mulders | H02H 3/165 |
| 2020/0341046 | A1 | 10/2020 | Pettissalo et al. | |
| 2021/0088556 | A1* | 3/2021 | Bernal | G01R 15/181 |
| 2021/0184449 | A1* | 6/2021 | Raisigel | G01R 31/50 |
| 2023/0006435 | A1* | 1/2023 | Melli | H02H 3/347 |

FOREIGN PATENT DOCUMENTS

| | | | |
|---|---|---|---|
| EP | 2814129 | A1 | 12/2014 |
| EP | 3582356 | A2 | 12/2019 |

* cited by examiner

METHOD AND APPARATUS FOR FAULT DETECTION IN DISTRIBUTION GRID

TECHNICAL FIELD

The present disclosure relates to methods of measuring currents for fault detections in distribution grids. Moreover, the present disclosure also relates to apparatuses for measuring currents for fault detections in distribution grids.

BACKGROUND

Distribution grids are an integral part of power generation and distribution systems, as they distribute power from transmission systems to several points of its utilization. The power may be utilized at premises (such as homes, offices, factories, and the like) of consumers. Typically, when electrical power is distributed, it is either in the form of single-phase or three-phase alternating current (AC) voltage. The distribution grids are prone to faults occurring due to lighting, wind, trees falling on lines, apparatus failure, and the like. Upon occurrence of a fault, voltage values and current values in the distribution grids deviate from their nominal ranges. As an example, the fault may cause over current, under voltage, unbalancing of three phases, high voltage surges, and the like. The faults undesirably result in interruption of normal operation of the power generation and distribution systems, failure of equipment, electrical fires, and the like. Therefore, it is imperative to detect faults in the distribution grids, to enable protection and smooth functioning of electrical assets.

Presently, several techniques are being employed for detecting faults in the distribution grids. These techniques typically relate to measurement of a sum current (i.e., a sum of phase currents) in three phase electrical distribution lines, to detect the faults. It is important to measure the sum current to detect high impedance earth faults, which are mostly the reason for forest fires in overhead distribution systems having solidly grounded systems. These techniques are associated with several limitations which are described hereinbelow in detail.

One technique involves winding a large Rogowski coil around conductors carrying all three phases of power. However, this technique can be implemented only in very limited real-world scenarios as individual conductors carrying individual phases may be spaced too far apart from one another. Moreover, a large loop in the large Rogowski coil creates inaccuracies, since a measurement value of the sum current is sensitive to a location of currents inside the coil. Furthermore, it is difficult and very expensive to manufacture very large Rogowski coils with high accuracy. It is also noteworthy that positional accuracy deteriorates quickly as a size of the Rogowski coil increases.

Another technique involves using one large Rogowski coil for measuring the sum current and two smaller Rogowski coils for measuring the phase currents. Such an installation is challenging, as a zero-sequence current in a cable shield must be compensated by rerouting grounding connectors inside the Rogowski coils. Thus, the installation cannot be done without disrupting the operation of the distribution system (which includes the distribution grid), and typically calls for disconnecting power supply for consumers, which is costly to distribution companies.

Yet another technique involves using one Rogowski coil wound around one conductor, for each of the three conductors carrying the three phases of power. In this technique, the phase currents in the three conductors are determined, and then the sum current is calculated from these individual measurements of the phase currents. A limitation of this technique is that a scale of front-end measurement circuit (that is arranged before an analog-to-digital converter) is improper. A current sensing range in the front-end measurement circuit is required to be at least of the order of a full load current in each phase which, in a realistic setting this could be of the order of several hundred amperes (for example, such as 500 Amperes, 630 Amperes, and the like). However, a current sensing requirement for measuring the sum current is quite less, typically of the order of a few Amperes or even less than 1 Ampere. Therefore, accurate measurement of the sum current in this manner becomes very difficult from resolution point of view.

Still another technique involves using a large windowed current transformer which makes accurate zero sequence current measurements in places where the individual conductors carrying individual phases are spaced far apart. The large windowed current transformer has customizable dimensions and can be installed in an overhead line load break switch, for example. However, the large windowed current transformer is expensive for installations in large quantities, has a low bandwidth (of the order of a few kilohertz (kHz)), and is practically impossible to install in tight spaces (for example, in spaces present in secondary distribution substations of the distribution grid).

In a United States patent document US 2020/241064 A1 (Dennis Mulders; "System and Method for Ground Fault Detection Using Current Measurement Coils"; assigned to Koninklujke Fabriek Inventum BV), there is disclosed a system for current measurement and ground fault detection. In embodiments, the system includes a plurality of phase current measurement coils configured to detect phase currents associated with at least one portion of a multi-phase system. The system further includes a plurality of phase current measurement circuits and a ground fault detection circuit connected to the phase current measurement coils. The phase current measurement circuits are configured to measure the phase currents detected by the phase current measurement coils, and the ground fault detection circuit is configured to measure a summation of the phase currents detected by the phase current measurement coils.

Therefore, in light of the foregoing discussion, there exists a need to overcome the aforementioned drawbacks associated with existing techniques that are being employed for detecting faults in the distribution grids.

SUMMARY

The present disclosure seeks to provide a method of measuring current for fault detection in a distribution grid. The present disclosure also seeks to provide an apparatus for measuring current for fault detection in a distribution grid. An aim of the present disclosure is to provide a solution that overcomes at least partially the problems encountered in prior art.

In one aspect, an embodiment of the present disclosure provides a method of measuring a current for fault detection in a distribution grid, the method comprising:

- installing three current transformers in series on three phase conductors by winding the three current transformers in a non-intrusive manner around a first phase, a second phase, and a third phase;
- measuring a voltage (V3) over the first current transformer, the second current transformer and the third current transformer; and
- using the voltage (V3) for determining a sum current;

characterised in that filtering the voltage (V3) with a low-pass filter (LF3) and a high-pass filter (HF3) to receive a low-pass signal voltage (LS3) and a high-pass signal voltage (HS3);

using the low-pass signal voltage (LS3) to determine zero-sequence current, and the high-pass signal voltage (HS3) to determine the fault transients in the sum current at fault occurrence; and using the sharp edges of the high-pass signal voltage (HS3) to synchronize a start time of travelling wave pulses, wherein the sharp edges are rapidly rising and/or rapidly falling edges of the high pass-signal voltage (HS3).

In another aspect, an embodiment of the present disclosure provides an apparatus for measuring current for fault detection in a distribution grid, the apparatus comprising three current transformers arranged to be installed in series on three phase conductors by winding the three current transformers in a non-intrusive manner around a first phase, a second phase, and a third phase when in use;

a measurement unit configured to measure a voltage (V3) over the first current transformer, the second current transformer and the third current transformer, and a calculation unit configured to use the measured voltage (V3) to determine a sum current, characterised in that the apparatus is configured to:

filter the voltage (V3) with a low-pass filter (LF3) and a high-pass filter (HF3) to receive a low-pass signal voltage (LS3) and a high-pass signal voltage (HS3);

use the low-pass signal voltage (LS3) to determine zero-sequence current, and the high-pass signal voltage (HS3) to determine the fault transients in the sum current at fault occurrence; and use the sharp edges of the high-pass signal voltage (HS3) to synchronize a start time of travelling wave pulses, wherein the sharp edges are rapidly rising and/or rapidly falling edges of the high pass-signal voltage (HS3).

Embodiments of the present disclosure substantially eliminate or at least partially address the aforementioned problems in the prior art, and enable the method to provide accurate, reliable, and high-resolution measurement of sum current and phase currents for efficient fault detection in a distribution grid.

Additional aspects, advantages, features, and objects of the present disclosure would be made apparent from the drawings and the detailed description of the illustrative embodiments construed in conjunction with the appended claims that follow.

It will be appreciated that features of the present disclosure are susceptible to being combined in various combinations without departing from the scope of the present disclosure as defined by the appended claims.

BRIEF DESCRIPTION OF THE DRAWINGS

The summary above, as well as the following detailed description of illustrative embodiments, is better understood when read in conjunction with the appended drawings. For the purpose of illustrating the present disclosure, exemplary constructions of the disclosure are shown in the drawings. However, the present disclosure is not limited to specific methods and instrumentalities disclosed herein. Moreover, those skilled in the art will understand that the drawings are not to scale. Wherever possible, like elements have been indicated by identical numbers.

Embodiments of the present disclosure will now be described, by way of example only, with reference to the following diagrams wherein.

Figure 1:
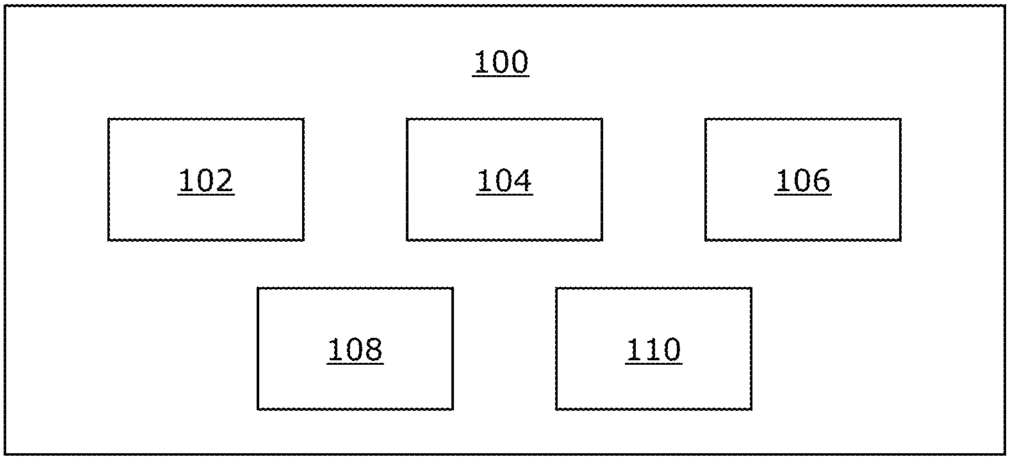
FIG. 1 illustrates an architecture of an apparatus for measuring current for fault detection in a distribution grid, in accordance with an embodiment of the present disclosure.

In the accompanying drawings, an underlined number is employed to represent an item over which the underlined number is positioned or an item to which the underlined number is adjacent. A non-underlined number relates to an item identified by a line linking the non-underlined number to the item. When a number is non-underlined and accompanied by an associated arrow, the non-underlined number is used to identify a general item at which the arrow is pointing.

DETAILED DESCRIPTION OF EMBODIMENTS

The following detailed description illustrates embodiments of the present disclosure and ways in which they can be implemented. Although some modes of carrying out the present disclosure have been disclosed, those skilled in the art would recognize that other embodiments for carrying out or practising the present disclosure are also possible.

In one aspect, an embodiment of the present disclosure provides a method of measuring a current for fault detection in a distribution grid, the method comprising:

installing three current transformers in series on three phase conductors by winding the three current transformers in a non-intrusive manner around a first phase, a second phase, and a third phase;

measuring a voltage (V3) over the first current transformer, the second current transformer and the third current transformer; and using the voltage (V3) for determining a sum current;

characterised in that filtering the voltage (V3) with a low-pass filter (LF3) and a high-pass filter (HF3) to receive a low-pass signal voltage (LS3) and a high-pass signal voltage (HS3);

using the low-pass signal voltage (LS3) to determine zero-sequence current, and the high-pass signal voltage (HS3) to determine the fault transients in the sum current at fault occurrence; and using the sharp edges of the high-pass signal voltage (HS3) to synchronize a start time of travelling wave pulses, wherein the sharp edges are rapidly rising and/or rapidly falling edges of the high pass-signal voltage (HS3).

In another aspect, an embodiment of the present disclosure provides an apparatus for measuring current for fault detection in a distribution grid, the apparatus comprising three current transformers arranged to be installed in series on three phase conductors by winding the three current transformers in a non-intrusive manner around a first phase, a second phase, and a third phase when in use;

a measurement unit configured to measure a voltage (V3) over the first current transformer, the second current transformer and the third current transformer, and a calculation unit configured to use the measured voltage (V3) to determine a sum current, characterised in that the apparatus is configured to:

filter the voltage (V3) with a low-pass filter (LF3) and a high-pass filter (HF3) to receive a low-pass signal voltage (LS3) and a high-pass signal voltage (HS3);

use the low-pass signal voltage (LS3) to determine zero-sequence current, and the high-pass signal voltage (HS3) to determine the fault transients in the sum current at fault occurrence; and use the sharp edges of the high-pass signal voltage (HS3) to synchronize a start time of travelling wave pulses, wherein the sharp edges are rapidly rising and/or rapidly falling edges of the high pass-signal voltage (HS3).

The present disclosure provides the aforementioned method and the aforementioned apparatus for measuring current for fault detection in distribution grid. The method enables accurate and reliable measurement of the sum current and the phase currents in order to efficiently detect the faults in the distribution grid. This enables in protection and smooth functioning of electrical assets of the distribution grid. The method is well suited for a current sensing requirement for measuring the sum current. Herein, the sum current is determined using the measured voltages around the three series connected current transformers. This facilitates accurate and high-resolution measurement of the sum current in small ranges (typically of the order of a few Amperes or even less than 1 Ampere) and avoids any need for scaling the ranges of measurements of the current transformers. It will be appreciated that a range of the three current transformers in the apparatus described herein, is of the order of several megahertz (MHz). The three current transformers can be conveniently installed about their corresponding phase conductors in a manner that the voltages are measured accurately. Beneficially, the installation of the apparatus can be done without disrupting the operation of the distribution grid. This facilitates saving time and costs involved in installing and using the apparatus. The apparatus is cost-efficient, space-efficient, reliable, easy to implement, and easy to use. As the method and apparatus enable efficient fault detection, they also facilitate in implementing fault rectification in an efficient manner.

The apparatus described herein performs steps of the method of measuring current for fault detection in the distribution grid. The apparatus is installed as required in the distribution grid. Several such apparatuses may be installed in the distribution grid.

Throughout the present disclosure, the term "measurement unit" refers to an electrical hardware equipment that is configured to measure voltages over the three current transformer. The measurement unit comprises one or more measurement equipment. Optionally, the measurement unit comprises three measurement equipment for measuring the voltages of the three series connected current transformers. Optionally, the measurement unit is an analog measurement unit. Alternatively, optionally, the measurement unit is a digital measurement unit. Examples of measurement equipment of the measurement unit include, but are not limited to, a voltmeter, a multimeter.

Throughout the present disclosure, the term "calculation unit" refers to hardware, software, firmware, or a combination of these that is configured to perform required calculations and determinations, and to detect the fault transients based on results from the required calculations and determinations. Examples of the calculation unit include, but are not limited to, a microcontroller, a microprocessor. The verbs "calculate", "determine" and "measure" may have the same meaning in this context.

The distribution grid is a part of electrical grid network which distributes electrical power from distribution substation(s) to premises (such as homes, offices, factories, and the like) of consumers. The distribution grid comprises power lines, power poles, transformers, switching circuits, protection circuits, and so forth. The distribution grid is prone to faults occurring due to lighting, wind, trees falling on lines, apparatus failure, and the like. As an example, the fault may cause over current, under voltage, unbalancing of three phases, high voltage surges, and the like. These faults cause deviations in voltage values and current values from their nominal ranges in the distribution grids. Examples of the faults include, but are not limited to, transient faults, earth faults, arcing faults, short circuit faults, open circuit faults, overload faults. Most of the faults in the distribution grid are transient in nature. In an example, the transient fault may occur due to a tree contact, a bird or an animal contact, a lightning strike, a clash of conductors due to an external force (such as, high wind speed), and the like.

It will be appreciated that the method facilitates automatic and accurate detection of the faults in the distribution grid. When the faults are accurately detected, fixing the faults would be considerably fast, thereby decreasing both its associated costs and downtime. This also improves performance of the distribution grid and increases service life of electrical assets of the distribution grid. Moreover, fast Fault Location, Isolation and Service Restoration (FLISR) is implemented, and minimum System Average Interruption Duration Index (SAIDI) and System Average Interruption Frequency Index (SAIFI) could be obtained, which further improves operational economics of the distribution grid.

Throughout the present disclosure, the term "current transformer" refers to a type of instrument transformer that is used for measuring alternating current (AC) in a conductor. Typically, the current transformer produces the AC in its secondary winding, the magnitude of which, is proportional to current being measured in its primary winding. The primary winding is connected in series with the conductor whose current is to be measured. Current transformers are used for measuring current and monitoring the operation of the distribution grid by detecting conditions such as, overcurrent, undercurrent, peak current, average current, and the like in the distribution grid. The current transformers are well-known in the art.

Optionally, at least one of the three current transformers is a Rogowski coil. The Rogowski coil is an electrical sensor that is used for measuring the AC or high-speed current pulses in a conductor. The Rogowski coil is a helical coil of wire with the lead from one end returning through the centre of the coil to the other end, in a manner that both terminals are at the same end of the coil. The Rogowski coil is installed around the conductor whose current is to be measured. Typically, the voltage induced in the Rogowski coil is proportional to the rate of change of current in the conductor. The Rogowski coil is connected to the measurement unit to provide an output signal that is proportional to the current. Beneficially, the apparatus of the present disclosure allows for installation of separate Rogowski coils for each of the phases, thereby minimizing tolerance difference therebetween. Additionally, the Rogowski coil does not possess a magnetic (iron) core, therefore, there is no saturation or non-linear effects associated with the magnitude of the current thus ensuring excellent linearity in current measurement.

Figure 5A:
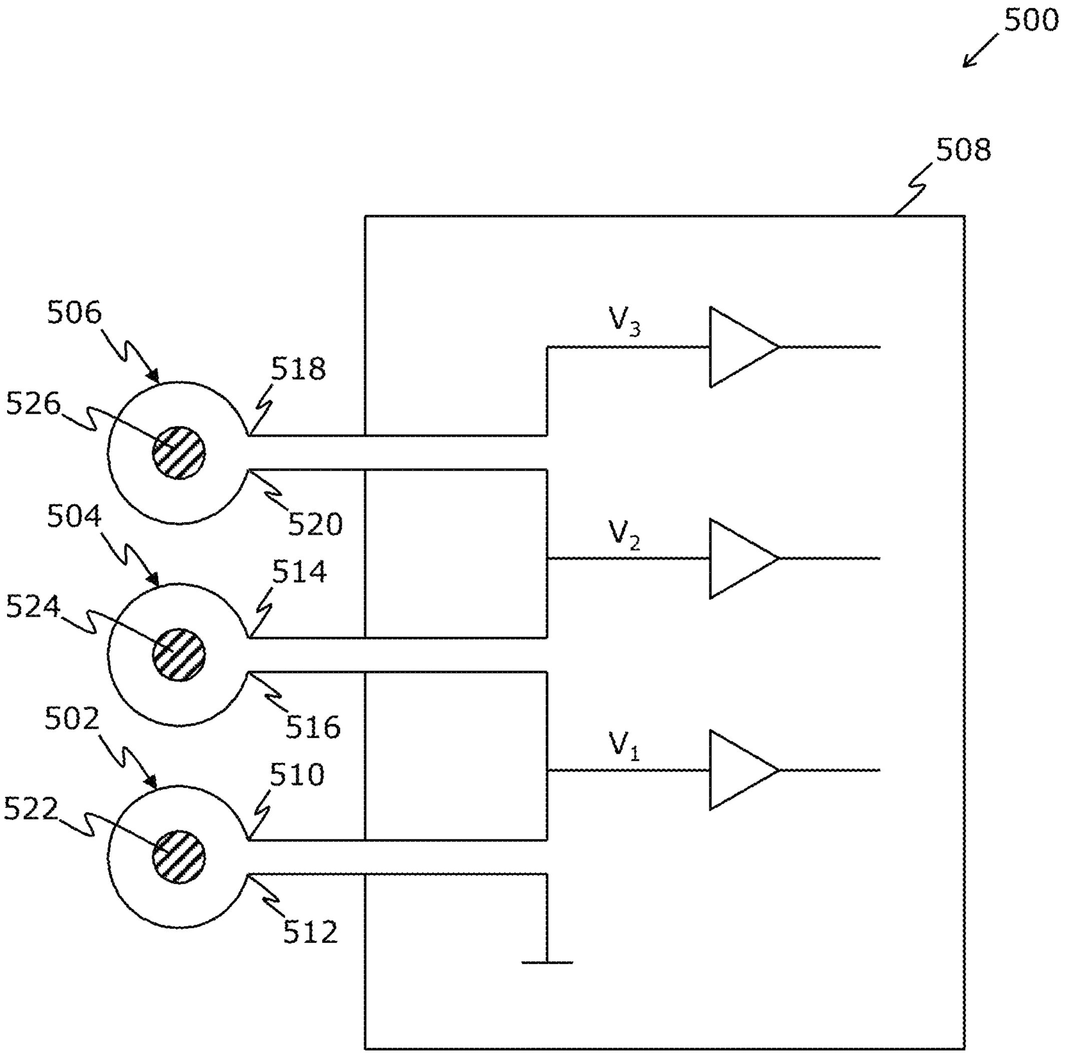
FIG. 5A is a simplified illustration of a current measurement setup within an apparatus for measuring current for fault detection in a distribution grid, in accordance with an embodiment of the present disclosure.

In the apparatus described herein, the three current transformers are connected in series such that the second current transformer is serially connected to both the first current transformer and the third current transformer. In particular, the first end of the first current transformer is attached to the second end of the second current transformer, and the first end of the second current transformer is attached to the second end of the third current transformer. One such exemplary series connection of the three current transformers is depicted in FIG. 5A.

The three phase conductors comprise a first conductor carrying the first phase, a second conductor carrying the second phase, and a third conductor carrying the third phase. Notably, the first current transformer is wound around the first phase corresponding to the first conductor, the second current transformer is wound around the second phase corresponding to the second conductor, and the third current transformer is wound around the third phase corresponding to the third conductor. Optionally, for the installation, a tool is employed to hold a given current transformer about a given conductor. Furthermore, optionally, a holder is employed to install the tool holding the given current transformer about the given conductor. It will be appreciated that the tool serves as a guiding element for installing the given current transformer in proximity of the given conductor, in a stable manner. This stability in positioning increases measurement accuracy and precision of the current transformer. To minimize positional inaccuracies, the given conductor is placed in middle of the given current transformer. In an example, the tool may be fabricated from nonconductive and non-magnetic material such as a polymer, a ceramic, a glass, a fibre, or any combination thereof. During the installation, cable shield of the given conductor is separated, and the given conductor is exposed. When the given current transformer is implemented as the Rogowski coil (specifically, a clamped-on Rogowski coil), the Rogowski coil is wound around the exposed given conductor in the non-intrusive manner. In such a case, during the installation the exposed given conductor is placed in middle of a standard low-size Rogowski coil. This facilitates minimizing positional inaccuracies (namely, positional errors) during measurement. It will be appreciated that the installation is done without disrupting operation of the distribution grid, and without disconnecting any power supply for the consumers. As an example, when the given current transformer is implemented as the Rogowski coil, the tool may be used for the installation to provide a support structure to the Rogowski coil, thereby ensuring stabilised orientation and positioning of the Rogowski coil about the given conductor. Upon the installation, the Rogowski coil may be bent into a curved shape around the given conductor, wherein the conductor may be located in a proximity of a centre of the curved shape, and the conductor may be perpendicular to a plane of the curved shape. It will be appreciated that for measuring a given voltage over a given current transformer, the measurement unit is connected in parallel to the given current transformer. Optionally, in this regard, a first measurement equipment is connected in parallel to the first current transformer to measure the first voltage, a second measurement equipment is connected in parallel to the first current transformer and the second current transformer to measure the second voltage, a third measurement equipment is connected in parallel to the first current transformer, the second current transformer, and the third current transformer to measure the third voltage.

Optionally, the first voltage lies in a range of 100 millivolts to 200 millivolts. As an example, the first voltage may be equal to 150 millivolts. Optionally, the second voltage lies in a range of 200 millivolts to 300 millivolts. As an example, the second voltage may be equal to 260 millivolts. Optionally, the third voltage lies in a range of 10 millivolts to 20 millivolts. As an example, the third voltage may be equal to 15 millivolts. Thus, the first and second have roughly the same level. Benefit of the solution is, that the third, sum current measurement has lower range, which makes it possible to more effectively measuring fast transients.

A current sensing requirement for measuring, i.e., determining, the sum current is quite low, typically of the order of a few Amperes or even less than 1 Ampere as the sum current is quite low. It will be appreciated that when the sum current is determined using the first voltage, the second voltage, and the third voltage, a value of the sum current would be much smaller, thus facilitating accurate measurement of the sum current. In an example, the sum current may be 1/200 (or 0.5%) of a load current. Using the first voltage, the second voltage, and the third voltage for determining the sum current enables scaling of preamplifier gains for the three current transformers to achieve considerable requisite resolution for accurate measurement of the sum current as well as the phase currents.

Optionally, the sum current is determined with following formulas:

the first voltage $V1=M(i1'(t))$, the second voltage $V2=M(i1'(t)+i2'(t))$ the third voltage $V3=M(i1'(t)+i2'(t)+i3'(t))$ wherein M is the mutual inductance of the first current transformer, the second current transformer and the third current transformer.

Herein, "$i1'(t)$" is a derivative of phase current of the first phase, "$i2'(t)$" is a derivative of phase current of the second phase, and "$i3'(t)$" is a derivative of phase current of the third phase. Notably, "$i1(t)$" is the phase current of the first phase, "$i2(t)$" is the phase current of the second phase, and "$i3(t)$" is the phase current of the third phase. Hereinafter, "$i1(t)$" is referred to as "first phase current", "$i2(t)$" is referred to as "second phase current", and "$i3(t)$" is referred to as "third phase current", for the sake of convenience only.

The above formulas enable in determining the derivates of the first phase current, the second phase current, and the third phase current. A sum of these derivates can be integrated to determine the sum current. The sum current is a sum of the first phase current, the second phase current, and the third phase current. In this regard, the sum current is mathematically expressed as $i1(t)+i2(t)+i3(t)$, and its derivative is given by measurement of the third voltage. It is to be noted that the sum current is a function of time, which means that the magnitude of the sum current may be different at different time instants. It will be appreciated that a range of the third voltage signal is dimensioned based on a magnitude of maximum sum current and is independent of magnitude of the load currents. In this regard, beneficially, the measurement of the third voltage signal achieves a high-resolution.

The mutual inductance of all the three current transformers is assumed to be equal.

Optionally, the phase currents are determined, or calculated, with following formulas:

for the first phase $\mathbf{i1}'(t)=\mathrm{v}\mathbf{1}(t)/M$, for the second phase $\mathbf{i2}'(t)=(\mathrm{v}\mathbf{2}(t)-\mathrm{v}\mathbf{1}(t))/M$, for the third phase $\mathbf{i3}'(t)=(\mathrm{v}\mathbf{3}(t)-\mathrm{v}\mathbf{2}(t))/M$, wherein M is the mutual inductance of the current transformers.

Herein, the measured first voltage, second voltage, and third voltage are represented as function of time $\mathrm{v}\mathbf{1}(t)$, $\mathrm{v}\mathbf{2}(t)$, and $\mathrm{v}\mathbf{3}(t)$, respectively. In such a case, the derivates of phase currents can be calculated as functions of time, and the phase currents can be calculated by integrating the derivates of phase currents. It will be appreciated that, optionally, an inverse transform is employed for calculating the actual phase currents from the measured first voltage, second voltage and third voltage (see the matrices in an example shown below). It will be also be appreciated that using the measured first voltage, second voltage, third voltage, and the determined sum current enable accurate measurements of phase currents.

EXAMPLE

Hereinbelow, there is provided an exemplary matrix representation of measurements of voltages, phase currents, sum current, and relationships between voltages and currents.

$$\text{Measured voltages, } V = \begin{pmatrix} V_1 \\ V_2 \\ V_3 \end{pmatrix} \tag{1}$$

$$\text{Phase currents, } I = \begin{pmatrix} I_1 \\ I_2 \\ I_3 \end{pmatrix} \text{ and sum current} = I1 + I2 + I3 \tag{2}$$

wherein V and I can be presented as follows:

$$V = sM\begin{pmatrix} 1 & 0 & 0 \\ 1 & 1 & 0 \\ 1 & 1 & 1 \end{pmatrix} I \tag{3}$$

$$I = \frac{1}{sM}\begin{pmatrix} 1 & 0 & 0 \\ -1 & 1 & 0 \\ 0 & -1 & 1 \end{pmatrix} V \tag{4}$$

Throughout the present disclosure, the term "fault transient" refers to a short-lived burst of energy in the distribution grid that is caused by a sudden change of state of the distribution grid. Typically, the fault transient comprises fault signals that are non-stationary type of signals. The fault transient dies very quickly by itself, but when the fault transient is detected repeatedly in the distribution grid, it strains network of the distribution grid, weakens isolation capability of the distribution grid at a location (namely, a site) of fault occurrence, and may lead to permanent disturbance and/or failure in electrical assets of the distribution grid. Therefore, for a smooth operability of the distribution grid, the fault transients are efficiently detected using the method to identify a fault occurrence so that required repairs can be made before a permanent failure.

Typically, the fault transients can be obtained from measurements of voltages and currents at distribution substations in the distribution grid. Generally, for purpose of detecting the fault transients, in some distribution substations, phase voltages and the sum current are recorded, while in other distribution substations phase voltages and phase currents are recorded. Optionally, the first fault transient is detected when a given current exceeds a predetermined threshold value. Moreover, optionally, the first fault transient is detected when the given current exceeds the predetermined threshold value for less than or equal to a predetermined time period. For example, there can be a situation, wherein the two first current sensors give near nominal phase current values, or nominal phase current values, while the third value is much lower, e.g., it may be the sum current—which normally is very low, except in fault situations.

Optionally, the method further comprises applying filters to the first voltage (V1), the second voltage (V2), the third voltage (V3) followingly:

- filtering the first voltage with a first low-pass filter and a first band-pass filter to receive a first low-pass signal voltage (LS1) and a first band-pass signal voltage (BS1);
- filtering the second voltage with a second low-pass filter and a second band-pass filter to receive a second low-pass signal voltage (LS2) and a second band-pass signal voltage (BS2);
- filtering the third voltage with a third low-pass filter and a third high-pass filter to receive a third low-pass signal voltage (LS3) and a third high-pass signal voltage (HS3);

using the filtered signal voltages to determine the first fault transient.

Generally, voltage signals contain noise signals and transient signals that are not required. It will be appreciated that for accurate determination of the fault transients, a signal conditioning setup is employed within the apparatus. Optionally, the signal conditioning setup includes the filters applied to the first voltage, the second voltage, and the third voltage, an analog-to-digital converter, and the calculation unit. Optionally, the filtered signal voltages are received by the calculation unit and are used by the calculation unit to determine the first fault transient. Optionally, the analog-to-digital converter comprises a plurality of analog-to-digital channels to convert a plurality of analog signals into corresponding plurality of digital signals. Optionally, the first voltage, the second voltage, and the third voltage are filtered prior to entering the analog-to-digital converter. In other words, the voltage outputs from the three series connected current transformers are analogically filtered prior to entering different analog-to-digital channels of the analog-to-digital converter. Optionally, the analog-to-digital converter is a part of the measurement unit.

Optionally, during the fault detection in the distribution grid, it is required to measure at least one of: 50 Hertz (Hz) load current in each of the three phases, harmonics of the load current in one or more of the three phases, 50 Hz zero-sequence current, the fault transients in the sum current at fault occurrence. In an example, the harmonics of the load current may be measured up to 20th harmonic and to a frequency of 1 kHz. Depending on fault detecting algorithms, bandwidth of the fault transients may be up to a frequency of 1 MHz.

Optionally, the third low-pass signal voltage (having the sum current) is used to determine zero-sequence current, and the third high-pass signal voltage is used to determine the fault transients in the sum current at fault occurrence. Optionally, the first low-pass signal voltage and the second low-pass signal voltage are used to determine the 50 Hertz (Hz) load current. It will be appreciated that using the low-pass signal voltages, the 50 Hz load currents of the three phases are determined with considerable accuracy, as noise (which is proportional to square root of bandwidth of signal voltages) gets eliminated. Optionally, the first band-pass signal voltage and the second band-pass signal voltage are used to determine the harmonics of the load current. It will be appreciated that the first band-pass filter and the second band-pass filter allows both a high and a low sampling rate for better data resolution. It will be appreciated that employing the signal conditioning setup is beneficial as range of the signal voltages is not impacted by the load current for measurements of the fault transients and the harmonics, and thus an entire range of the signal voltages could be exploited. It will also be appreciated that filtering the first voltage, the second voltage, and the third voltage could be performed in any order irrespective of the order of measurements of the first voltage, the second voltage, and the third voltage.

Optionally, in the method

- the first low-pass filter passes signals with a frequency lower than 150 Hz;
- the first band-pass filter passes signals with a frequency of 2 kHz;
- the second low-pass filter passes signals with a frequency lower than 150 Hz;
- the second band-pass filter passes signals with a frequency of 2 kHz;
- the third low-pass filter passes signals with a frequency lower than 150 Hz;
- the third high-pass filter passes signals higher than 1 kHz.

Optionally, the first band-pass filter and the second band-pass filter pass signals with the frequency of 2 kHz only. Alternatively, optionally, the first band-pass filter and the second band-pass filter pass signals with a frequency lying in a predetermined range of kHz. It will be appreciated that the first low-pass filter and the second low-pass filter pass signals with the frequency lower than 150 Hz to determine the 50 Hertz (Hz) load current accurately. The first band-pass filter and the second band-pass filter pass signals with a frequency of 2 kHz to determine the harmonics of the load current accurately. It will also be appreciated that the third low-pass filter passes signals with the frequency lower than 150 Hz to determine the zero-sequence current accurately. The third high-pass filter passes signals higher than 1 kHz so that the fault transients (for example, with a frequency of 10 kHz) would not saturate measurement (as the harmonics would be filtered out) and are determined accurately.

Optionally, the method further comprises detecting a second fault transient in the distribution grid by using the third high-pass signal voltage (HS3) to calculate a transient voltage. The transient voltage is a short-lived unwanted voltage in the distribution grid. Generally, the transient voltage ranges from a few volts to several thousand volts and lasts a few microseconds up to a few milliseconds. Optionally, the second fault transient is detected when the third high-pass signal voltage exceeds a predetermined threshold value. Moreover, optionally, the second fault transient is detected when the third high-pass signal voltage exceeds the predetermined threshold value for less than or equal to a predetermined time period.

Optionally, sharp edges of the third high-pass signal voltage (HS3) are used to synchronize a start time of travelling wave pulses. Notably, the sharp edges (i.e., rapidly rising and rapidly falling edges) of the third high-pass signal voltage are indicative of fault transients. As the third high-pass signal voltage is indicative of a high-frequency sum current signal, the sharp edges are represented when the high-frequency sum current signal exceeds a predetermined threshold. When the fault occurs on the distribution grid, the high-frequency sum current signal would travel towards both ends of a distribution line in the distribution grid. In such a case, the travelling wave pulses corresponding to the fault transient are generated in the distribution system. The travelling wave pulses generated due to the fault are reflected between a fault location and distribution substations at different sides of the fault location in the distribution line. The travelling wave pulses may have frequency components and are generally of short duration and travel with velocity similar to velocity of light. Time periods taken by the travelling wave pulses to travel from the fault location and to the distribution substations at the different sides of the fault location are used to determine the fault location. A given time period taken by a given travelling wave pulse to travel from the fault location and to a given distribution substation is directly proportional to a distance between the fault location and the given distribution substation. During propagation of the traveling wave pulses, distortions of wavefront of the traveling wave pulse and broadening of fall time or rise time of the wavefront occurs due to dispersion effect. In such a case, it is difficult to accurately determine an arrival time of the travelling wave from the fault location and determine a velocity of the traveling wave pulse. It will be appreciated that by using the sharp edges of the third high-pass signal voltage to synchronize the start time of travelling wave pulses, dispersion effect due to the travelling wave pulse is minimized. This improves singularity of the traveling wave pulse, and thus facilitates accurate and reliable detection of the fault location.

In an example, there may occur a fault between two distribution substations of the distribution grid that are separated from each other by a distance D unit. When the fault is located at a distance of D/2 unit from either of the two substations, the start time of the travelling wave pulse from the fault location is such that the travelling wave pulse is detected at a same time at both the distribution substations. Using the arrival time of the travelling wave from the fault location, the fault location may be accurately determined to be in the middle of the two distribution substations. However, there may occur another fault that is located closer to one of the two substations. In such a case, the arrival times of the travelling wave pulses from this fault location are different and such that the travelling wave pulse is detected earlier (for example, at a time instant t1) at closer distribution substation, and later (for example, at a time instant t2 which is later than t1) at farther distribution substation.

Optionally, the third high-pass signal voltage (HS3) is used to acquire information about partial discharges. A partial discharge is a localized dielectric breakdown of a portion of an electrical insulation or cable, that is under a high voltage. The partial discharge usually starts in voids, cracks, or inclusions that are within the electrical insulation or cable. Notably, the partial discharges are manifestation of faults within the electrical insulation or cable of the distribution lines in the distribution grid. During the partial discharge, a discharge transient is generated and propagated from the fault location. This discharge transient is typically of a high frequency and a low amplitude. Optionally, occurrence of the partial discharges is identified by detecting high-frequency pulses in the third high-pass signal voltage. Optionally, the information about the partial discharges comprises at least one of: a current of discharge transient, a voltage of discharge transient, a frequency of discharge transient, an angular frequency of discharge transient. Optionally, the method further comprises utilizing the information about the partial discharges to determine the fault location. Optionally, the partial discharge takes place at a frequency dictated by the velocity of the travelling wave pulse in the distribution line and a distance between the fault location and the apparatus. Optionally, in this regard, the frequency of the discharge transient is directly proportional to the velocity of the travelling wave pulse, and inversely proportional to the distance between the fault location and the apparatus. It will be appreciated that, optionally, when the velocity of the travelling wave pulse is equal to or nearly equal to the speed of the light, the frequency of the discharge transient depends only on the fault distance, and thus can be used easily to determine the fault location. Beneficially, the information about partial discharges facilitates accurate and reliable detection of the fault locations in the electrical insulation or cable of the distribution lines in the distribution grid.

Optionally, the measured first voltage (V1), second voltage (V2) and third voltage (V3) are used to measure harmonics and total harmonic distortion in power lines for detecting anomalies. The harmonic is a voltage or a current at a frequency that is a multiple of fundamental frequency (for example, 50 Hz). Such a voltage or a current is produced by operating non-linear loads in the distribution grid. Generally, lesser the sinusoidal nature of the voltage signal or the current signal, stronger are the harmonic components of the voltage signal or of the current signal, and thus higher the total harmonic distortion. The harmonics in the distribution grid cause deterioration of power quality and are responsible for increased heating of electrical assets (such as the three phase conductors, overhead power lines, the current transformers, and the like) in the distribution grid. Optionally, the calculation unit is configured to measure (particularly calculate) the harmonics and the total harmonic distortion. Optionally, in this regard, the calculation unit employs at least one mathematical formula. Typically, a harmonic corresponding to a given voltage is a ratio of root mean square (RMS) value of a measurement of the given voltage of harmonic frequency to an RMS voltage of the fundamental frequency. Moreover, some positive sequence harmonics (for example, a 4th harmonic, a 7th harmonic, a 10th harmonic, and the like) are typically undesirable in the power lines of the distribution grid. Such positive sequence harmonics may be detected as anomalies and should be minimized. Moreover, the total harmonic distortion (THD) is a measure of harmonic distortion that is present in the distribution grid. The value of the THD should be as low as possible in the distribution grid. The THD is defined as a ratio of value of root mean square (RMS) voltages of all the harmonic frequencies (from the 2nd harmonic) to the RMS voltage of the fundamental frequency. Optionally, the THD measurement is based on either current harmonics or voltage harmonics.

For illustration purposes only, there will now be described an example implementation of the method of measuring current for fault detection in distribution grid. In an exemplary implementation, the apparatus may be implemented as a Fault Passage Indicator (FPI) for the fault detection in the distribution grid. The FPI may be installed in distribution substations of the distribution grid. Three current transformers are arranged in series having measured first voltage, second voltage, and third voltage, respectively. These measured voltages may be used to determine a sum current. These measured voltages and the sum current may be used to calculate the phase currents in the first phase, the second phase, and the third phase, respectively. Thereafter, the sum current and phase currents are used to detect fault transients (that indicate fault conditions) in the distribution grid. Optionally, the apparatus is coupled in communication with a remote device via a communication network. In such a case, a communication unit of the apparatus is configured to obtain data pertaining to the fault conditions from the calculation unit, and to send such data to the remote device. Examples of the remote device may include, but are not limited to, a data repository, a computing device whereat a fault management system is implemented, a cloud server. It will be appreciated that the communication network may be wired, wireless, or a combination thereof. Examples of the communication network may include, but are not limited to, Internet, Wide Area Networks (WANs), Metropolitan Area Networks (MANs), a telecommunication network, and a radio network. When the data pertaining to the fault conditions (i.e., calculation data of the calculation unit) is received at the remote device, necessary actions are taken (by an electrical distribution grid operator and/or the fault management system) to rectify the fault.

The present disclosure also relates to the method as described above. Various embodiments and variants disclosed above, with respect to the aforementioned first aspect, apply mutatis mutandis to the apparatus.

Optionally, the calculation unit determines the sum current using following formulas:

the first voltage $V1=M(i1'(t))$, the second voltage $V2=M(i1'(t)+i2'(t))$ the third voltage $V3=M(i1'(t)+i2'(t)+i3'(t))$ wherein M is the mutual inductance of the current transformers.

Optionally, the calculation unit calculates, i.e., determines, the phase currents using following formulas:

for the first phase $i1'(t)=v1(t)/M$, for the second phase $i2'(t)=(v2(t)-v1(t))/M$, for the third phase $i3'(t)=(v3(t)-v2(t))/M$, wherein M is the mutual inductance of the current transformers.

Optionally, the apparatus further comprises filters to be applied to the first voltage, the second voltage, the third voltage followingly:

- a first low-pass filter (LF1) and a first band-pass filter (BF1) to filter the first voltage (V1) to receive a first low-pass signal voltage (LS1) and a first band-pass signal voltage (BS1);
- a second low-pass filter (LF2) and a second band-pass filter (BF2) to filter the second voltage (V2) to receive a second low-pass signal voltage (LS2) and a second band-pass signal voltage (BS2);
- a third low-pass filter (LF3) and a third high-pass filter (HF3) to filter the third voltage (V3) to receive a third low-pass signal voltage (LS3) and a third high-pass signal voltage (HS3), wherein the calculation unit is further configured to use the filtered signal voltages to determine the first fault transient.

Optionally, at least one of the three current transformers is a Rogowski coil.

Optionally, the calculation unit is further configured to detect a second fault transient in the distribution grid by using the third high pass signal voltage (HS3) to calculate a transient voltage.

Optionally, in the apparatus the first low-pass filter passes signals with a frequency lower than 150 Hz;

the first band-pass filter passes signals with a frequency of 2 kHz;

the second low-pass filter passes signals with a frequency lower than 150 Hz;

the second band-pass filter passes signals with a frequency of 2 kHz;

the third low-pass filter passes signals with a frequency lower than 150 Hz;

the third high-pass filter passes signals higher than 1 kHz.

Optionally, in the apparatus, sharp edges of the third high-pass signal voltage (HS3) are used to synchronize a start time of travelling wave pulses.

Optionally, in the apparatus, the third high-pass signal voltage (HS3) is used to acquire information about partial discharges.

Optionally, in the apparatus, the measured first voltage (V1), second voltage (V2) and third voltage (V3) are used to measure harmonics and total harmonic distortion in power lines for detecting anomalies.

DETAILED DESCRIPTION OF THE DRAWINGS

Referring to FIG. 1, illustrated is an architecture of an apparatus 100 for measuring current for fault detection in a distribution grid, in accordance with an embodiment of the present disclosure. The apparatus 100 comprises three current transformers (depicted as a first current transformer 102, a second current transformer 104, and a third current transformer 106), a measurement unit 108, and a calculation unit 110.

Figure 2:
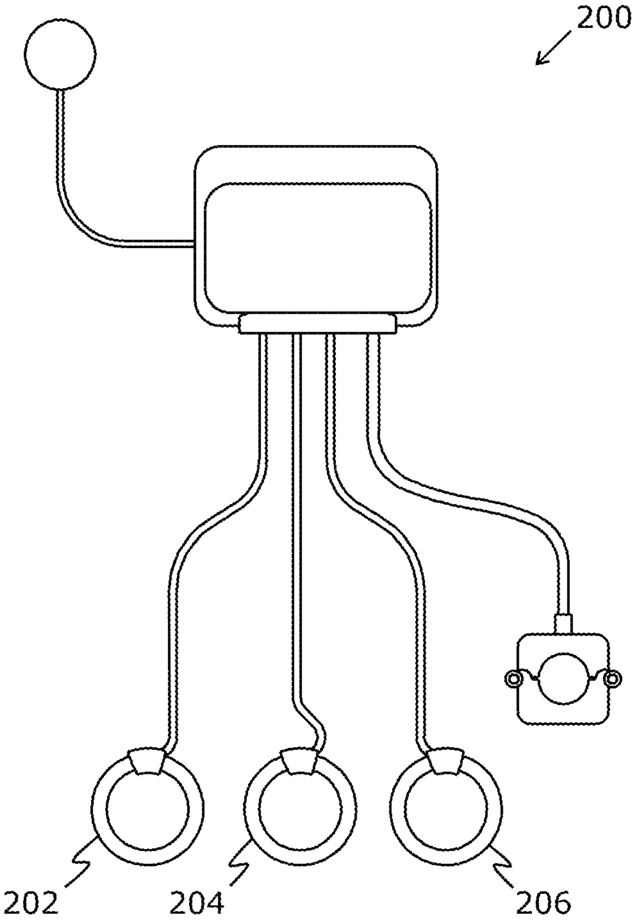
FIG. 2 is a schematic illustration of an apparatus for measuring current for fault detection in a distribution grid, in accordance with an embodiment of the present disclosure.

Referring to FIG. 2, illustrated is a schematic illustration of an apparatus 200 for measuring current for fault detection in a distribution grid, in accordance with an embodiment of the present disclosure. The apparatus 200 is a Fault Passage Indicator (FPI) and includes three current transformers (depicted as a first current transformer 202, a second current transformer 204, and a third current transformer 206), a measurement unit (not shown), and a calculation unit (not shown).

Figure 3:
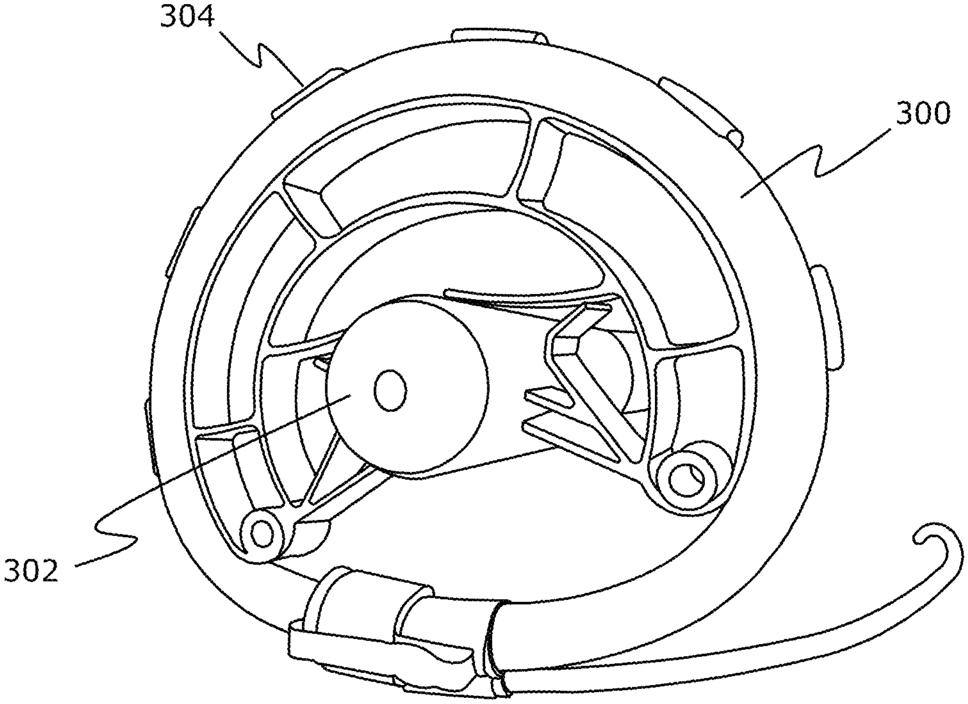
FIG. 3 is a perspective view illustrating how a current transformer implemented as a Rogowski coil is installed on a given conductor, in accordance with an embodiment of the present disclosure.

Referring to FIG. 3, illustrated is a perspective view illustrating how a given current transformer 300 implemented as a Rogowski coil is installed on a given conductor 302, in accordance with an embodiment of the present disclosure. The current transformer 300 is bent into a curved shape (shown, for example, as a circular shape) and at least partially surrounds the given conductor 302 when installed. The given conductor 302 is located in a proximity of a centre of the curved shape, and the given conductor 302 is perpendicular to a plane of the curved shape. This installation is an optimal installation of the current transformer 300 around the given conductor 302. A tool 304 may be employed to hold the current transformer 300 (i.e., the Rogowski coil) about the given conductor 302.

Figure 4:
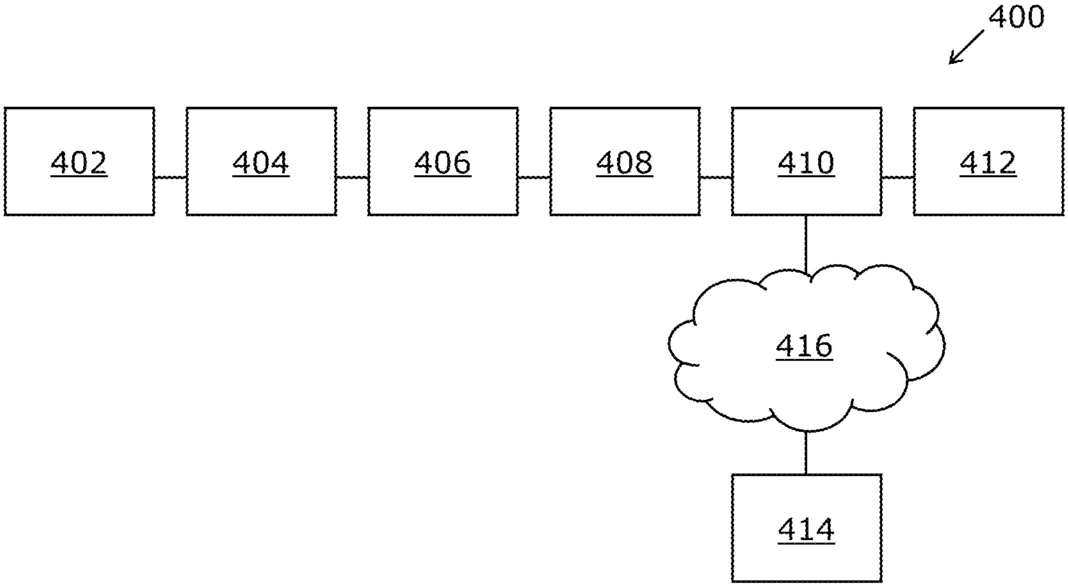
FIG. 4 is an exemplary environment where an apparatus for measuring current for fault detection in a distribution grid is used, in accordance with an embodiment of the present disclosure.

Referring to FIG. 4, illustrated is an exemplary environment 400 where an apparatus for measuring current for fault detection in a distribution grid is used, in accordance with an embodiment of the present disclosure. The environment 400 represents a power generation and distribution system wherein a power source 402 is utilized for generation of power at a power station 404, a transmission system 406 transmits the power from the power station 404 to a distribution substation 408, and then a distribution grid 410 distributes the power from the distribution substation 408 to premises 412 of consumers. The apparatus for measuring current for fault detection is used in the distribution grid 410. The apparatus may be coupled in communication with a remote device 414, via a communication network 416.

Referring to FIG. 5A, illustrated is a simplified illustration of a current measurement setup 500 within an apparatus for measuring current for fault detection in a distribution grid, in accordance with an embodiment of the present disclosure. The current measurement setup 500 includes three current transformers comprising a first current transformer 502, a second current transformer 504, and a third current transformer 506, and a measurement unit 508. Each current transformer has a first end and a second end, wherein the first current transformer 502 has a first end 510 and a second end 512, the second current transformer 504 has a first end 514 and a second end 516, and the third current transformer 506 has a first end 518 and a second end 520. The first end 510 of the first current transformer 502 is connected to the second end 516 of the second current transformer 504 when in use, and the first end 514 of the second current transformer 504 is connected to the second end 520 of the third current transformer 506 when in use. These three connected current transformers 502, 504, and 506 are arranged to be installed in series on three phase conductors 522, 524, and 526, respectively, by winding the three current transformers 502, 504, and 506 in a non-intrusive manner. The first current transformer 502 is wound around a first phase corresponding to the conductor 522, the second current transformer 504 is wound around a second phase corresponding to the conductor 524, and the third current transformer 506 is wound around a third phase corresponding to the conductor 526 when in use.

In FIG. 5A, the measurement unit 508 measures voltages of the three series connected current transformers 502, 504, and 506 by: measuring a first voltage (V1) over the first current transformer 502, measuring a second voltage (V2) over the first current transformer 502 and the second current transformer 504, measuring a third voltage (V3) over the first current transformer 502, the second current transformer 504 and the third current transformer 506. The second end 512 of the first current transformer 502 is connected to ground. The ground is reference point for the measurements.

Figure 5B:
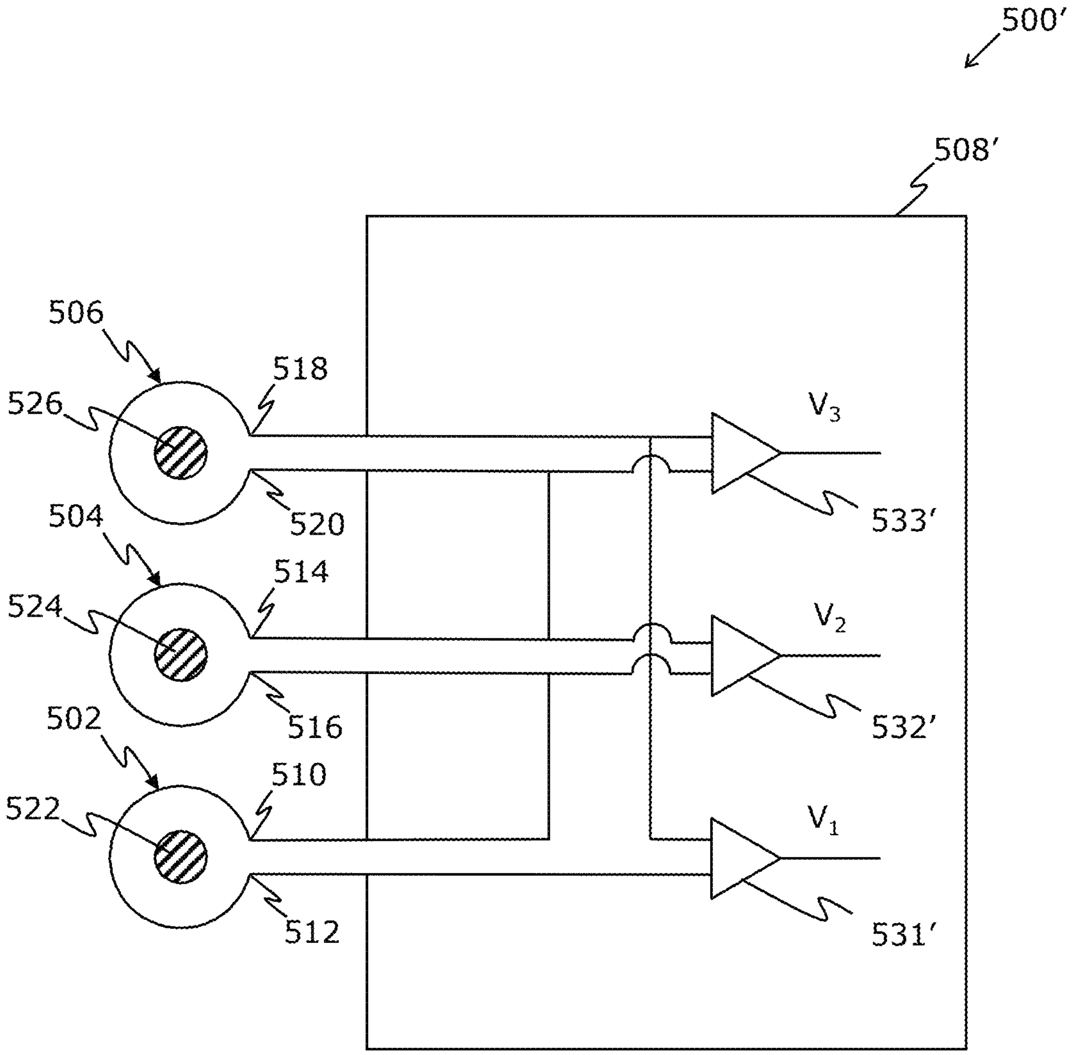
FIG. 5B is an alternative implementation to the measurement setup shown in FIG. 5A, using differential amplifiers.

Referring to FIG. 5B, illustrated is an alternative implementation to the measurement setup shown in FIG. 5A, using differential amplifiers. In FIG. 5B, the current measurement setup 500' includes three current transformers comprising a first current transformer 502, a second current transformer 504, and a third current transformer 506, which are connected in series as illustrated in FIG. 5A, and a measurement unit 508'. In FIG. 5B, the measurement unit 508' is configured so that the first end 518 of the third current transformer 506 is connected to a first input of a first differential amplifier 531' and a first input of a third differential amplifier 533'. The second end 520 of the third current transformer 506 is connected to a second input of the third differential amplifier 533' and the first end 514 of the second current transformer 504. In addition, the first end 514 of the second current transformer 504 is connected to a first input of a second differential amplifier 532'. The second end 516 of the second current transformer 504 is connected to a second input of the second differential amplifier 532' and the first end 510 of the first current transformer 502. In addition, the second end 512 of the first current transformer 502 is connected to a second input of the first differential amplifier 531'.

Figure 5C:
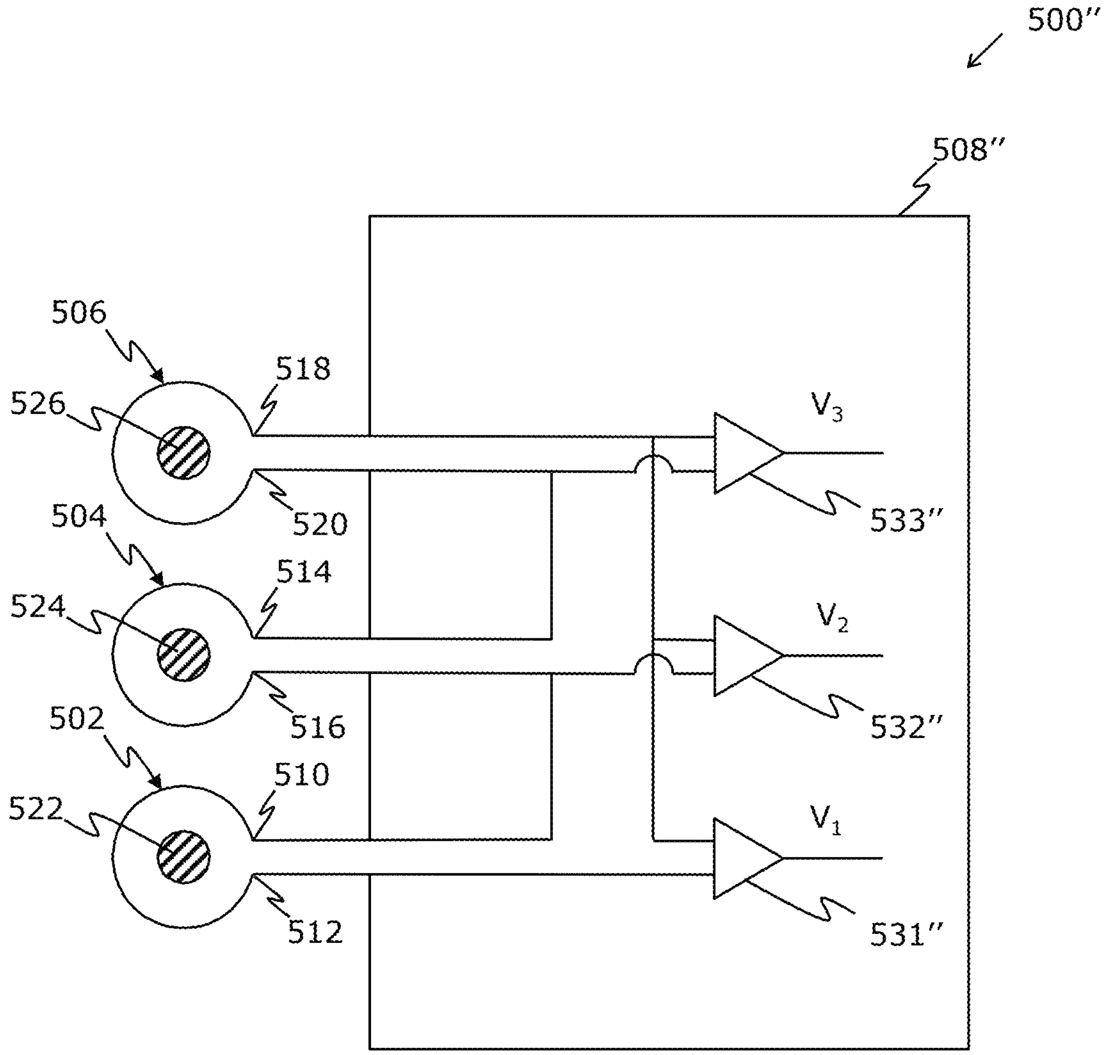
FIG. 5C is another alternative implementation to the measurement setup shown in FIG. 5A, using differential amplifiers.

Referring to FIG. 5C, illustrated is another alternative implementation to the measurement setup shown in FIG. 5A, using differential amplifiers. In FIG. 5C, the current transformers 502, 504 and 506 are connected in series as illustrated in FIG. 5A. In FIG. 5C, the measurement unit 508" is configured so that the first end 518 of the third current transformer 506 is connected to a first input of a first differential amplifier 531", a first input of a second differential amplifier 532" and a first input of a third differential amplifier 533". In addition, in FIG. 5C, the second end 520 of the third current transformer 506 is connected to a second input of the third differential amplifier 533" and the first end 514 of the second current transformer 504. The second end 516 of the second current transformer 504 is connected to a second input of the second differential amplifier 532" and the first end 510 of the first current transformer 502. In addition, the second end 512 of the first current transformer 502 is connected to a second input of the first differential amplifier 531".

An advantage of current measurement setups as illustrated in FIGS. 5B and 5C over the current measurement setup illustrated in FIG. 5A is significantly reduced noise in measurements due to capacitive coupling of signal lines or sensors.

Figure 6:
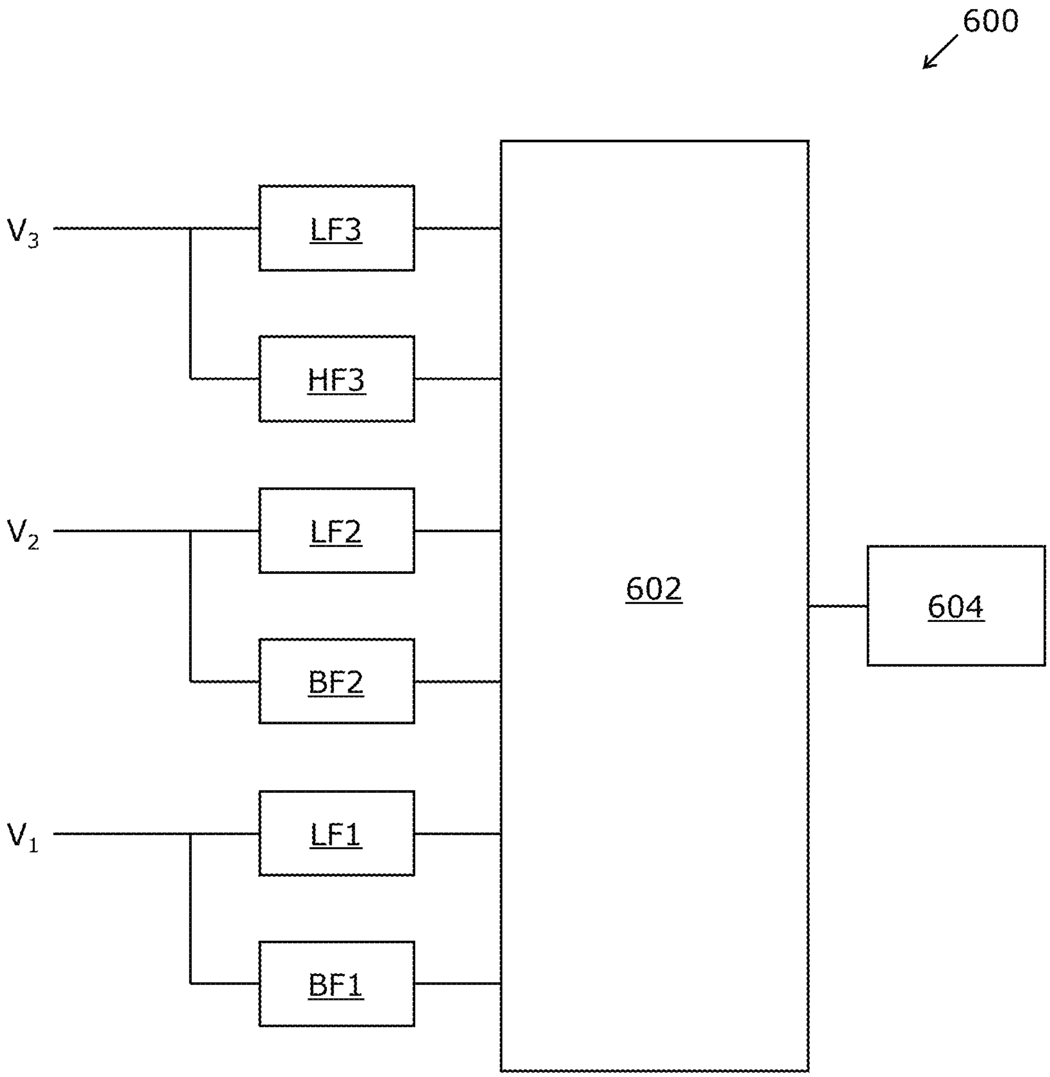
FIG. 6 is a simplified illustration of a signal conditioning setup within an apparatus for measuring current for fault detection in a distribution grid, in accordance with an embodiment of the present disclosure.

Referring to FIG. 6, illustrated is a simplified illustration of a signal conditioning setup 600 within an apparatus for measuring current for fault detection in a distribution grid, in accordance with an embodiment of the present disclosure. The signal conditioning setup 600 includes filters to be applied to a first voltage (V1), a second voltage (V2), and a third voltage (V3); an analog-to-digital converter 602; and a calculation unit 604. The filters include a first low-pass filter (LF1) and a first band-pass filter (BF1) for filtering the first voltage (V1), a second low-pass filter (LF2) and a second band-pass filter (BF2) for filtering the second voltage (V2), and a third low-pass filter (LF3) and a third high-pass filter (HF3) for filtering the third voltage (V3). The analog-to-digital converter 602 receives a first low-pass signal voltage (LS1) and a first band-pass signal voltage (BS1), a second low-pass signal voltage (LS2) and a second band-pass signal voltage (BS2), and a third low-pass signal voltage (LS3) and a third high-pass signal voltage (HS3). The calculation unit 604 uses the filtered signal voltages to determine fault transients.

Figure 7:
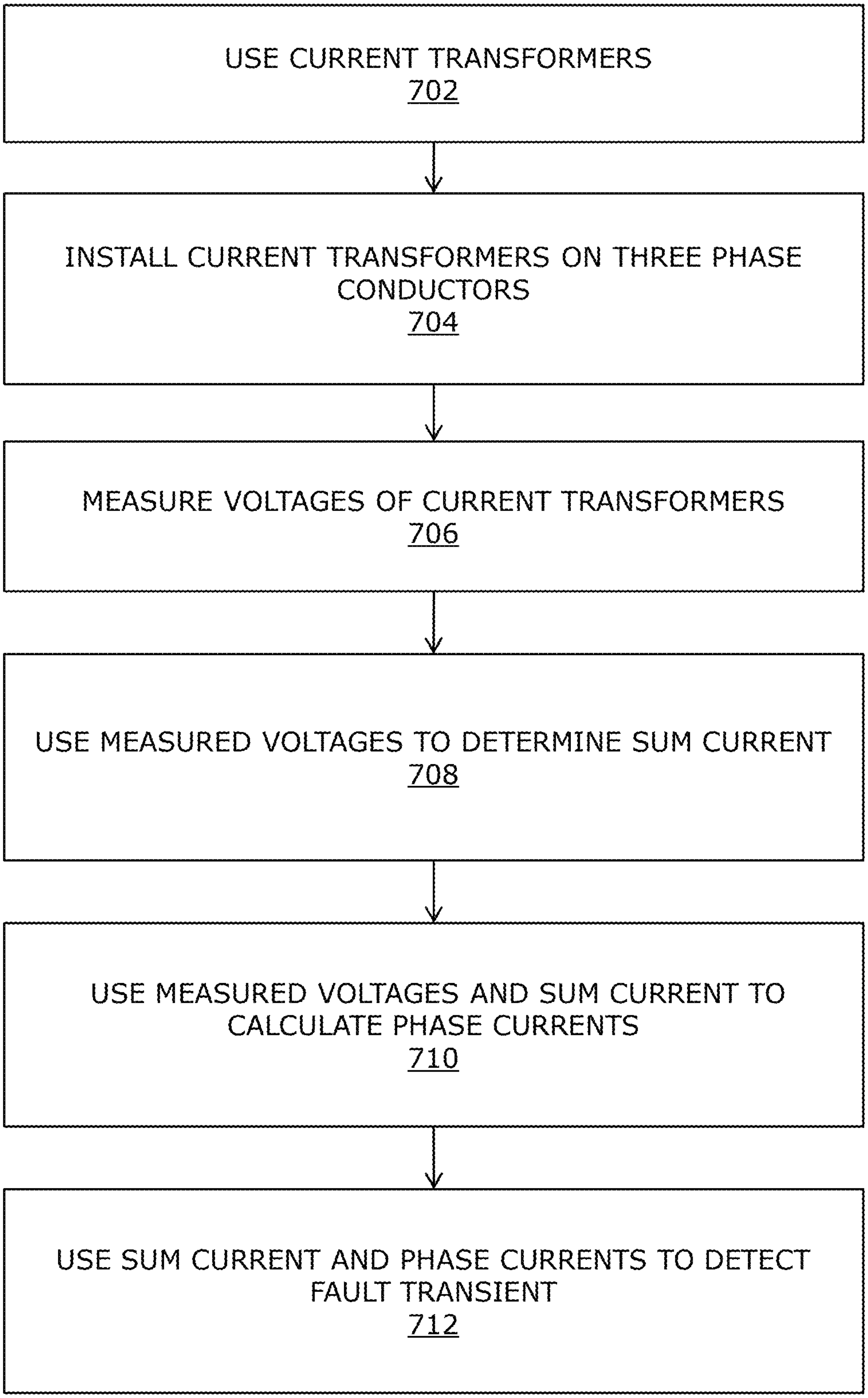
FIG. 7 illustrates steps of a method of measuring current for fault detection in a distribution grid, in accordance with an embodiment of the present disclosure.

Referring to FIG. 7, illustrated are steps of a method of measuring current for fault detection in a distribution grid, in accordance with an embodiment of the present disclosure. At step 702, three current transformers are used. Each current transformer has a first end and a second end, and the three current transformers are connected to one another by attaching a first end of a first current transformer to a second end of a second current transformer, attaching a first end of the second current transformer to a second end of a third current transformer. At step 704, the three connected current transformers are installed in series on three phase conductors by winding the three current transformers in a non-intrusive manner, by winding the first current transformer around a first phase, winding the second current transformer around a second phase, winding the third current transformer around a third phase. At step 706, voltages of the three series connected current transformers are measured by measuring a first voltage over the first current transformer, measuring a second voltage over the first current transformer and the second current transformer, measuring a third voltage over the first current transformer, the second current transformer and the third current transformer. At step 708, the measured first voltage, second voltage and third voltage are used for determining a sum current. At step 710, the measured first voltage, second voltage, third voltage and the determined sum current are used for calculating phase currents. At step 712, the determined sum current and phase currents are used to detect a first fault transient in the distribution grid.

The steps 702, 704, 706, 708, 710, and 712 are only illustrative and other alternatives can also be provided where one or more steps are added, one or more steps are removed, or one or more steps are provided in a different sequence without departing from the scope of the claims herein.

Modifications to embodiments of the present disclosure described in the foregoing are possible without departing from the scope of the present disclosure as defined by the accompanying claims. Expressions such as "including", "comprising", "incorporating", "have", "is" used to describe and claim the present disclosure are intended to be construed in a non-exclusive manner, namely allowing for items, components or elements not explicitly described also to be present. Reference to the singular is also to be construed to relate to the plural.

The invention claimed is:

1. A method of measuring a current for fault detection in a distribution grid, the method comprising:

installing a first of three current transformers around a first phase conductor of three phase conductors, a second of the three current transformers around a second phase conductor of the three phase conductors, and a third of the three current transformers around a third phase conductor of the three phase conductors;

connecting secondary windings of the first, second and third current transformers in series to form a series connection;

measuring a voltage (V3) over the series connection; and using the measured voltage (V3) for determining a sum current;

filtering the measured voltage (V3) with a low-pass filter (LF3) and a high-pass filter (HF3) to generate a low-pass signal voltage (LS3) and a high-pass signal voltage (HS3);

using the low-pass signal voltage (LS3) to determine zero-sequence current, and the high-pass signal voltage (HS3) to determine fault transients in the sum current at fault occurrence; and using sharp edges of the high-pass signal voltage (HS3) to synchronize a start time of travelling wave pulses, wherein the sharp edges are rapidly rising and/or rapidly falling edges of the high pass-signal voltage-(HS3).

2. The method according to claim 1, wherein the low-pass filter (LF3 passes signals with a frequency lower than 150 Hz; and the high-pass filter (HF3) passes signals higher than 1 kHz.

3. The method according to claim 1, wherein the high-pass signal voltage (HS3) is used to detect high-frequency pulses indicative of partial discharges and to determine at least one of current, voltage, frequency, or angular frequency of a discharge transient.

4. The method according to claim 1, wherein at least one of the three current transformers is a Rogowski coil.

5. The method according to claim 1, further comprising:

measuring a first voltage (V1) over the first current transformer and a second voltage (V2) over the first current transformer and the second current transformer;

calculating phase currents based on the first voltage (V1), the second voltage (V2), the measured voltage (V3), and the determined sum current; and using the determined sum current and the calculated phase currents to detect a first fault transient in the distribution grid.

6. An apparatus for measuring current for fault detection in a distribution grid, the apparatus comprising:

three current transformers, wherein a first of the three current transformers is-arranged to be installed around a first phase conductor of three phase conductors, a second of the three current transformers is arranged to be installed around a second phase conductor of the three phase conductors, and a third of the three current transformers is arranged to be installed around a third phase conductor of the three phase conductors, and wherein the secondary windings of the first, second and third current transformers are connected in series to form a series connection;

a measurement unit configured to measure a voltage (V3) over the series connection;

a calculation unit configured to use the measured voltage (V3) to determine a sum current, and a low-pass filter (LF3) and a high-pass filter (HF3) configured to filter the measured voltage (V3) to generate a low-pass signal voltage (LS3) and a high-pass signal voltage (HS3);

wherein the calculation unit is configured to use the low-pass signal voltage (LS3) to determine zero-sequence current, and to use the high-pass signal voltage (HS3) to determine fault transients in the sum current at fault occurrence; and wherein the calculation unit is configured to use sharp edges of the high-pass signal voltage (HS3) to synchronize a start time of travelling wave pulses, wherein the sharp edges are rapidly rising and/or rapidly falling edges of the high pass-signal voltage (HS3).

7. The apparatus according to claim 6, wherein the high-pass signal voltage (HS3) is used to detect high-frequency pulses indicative of partial discharges and to determine at least one of current, voltage, frequency, or angular frequency of a discharge transient.

8. The apparatus according to claim 6, wherein at least one of the three current transformers is a Rogowski coil.

9. The apparatus according to claim 6, further comprising:

a communication unit coupled in communication with a remote device via a communication network, wherein the communication unit is configured to obtain data pertaining to the fault conditions from the calculation unit, and send obtained data to the remote device.

10. The apparatus according to claim 9, wherein the remote device comprises a computing device at which a fault management system is implemented, and wherein the remote device is configured to receive the data pertaining to the fault conditions for use by the fault management system in rectifying the fault.

11. The apparatus according to claim 6, wherein the measurement unit is further configured to measure a first voltage (V1) over the first current transformer and a second voltage (V2) over the first current transformer and the second current transformer; and wherein the calculation unit is further configured to calculate phase currents based on the first voltage (V1), the second voltage (V2), the measured voltage (V3), and the determined sum current, and to use the determined sum current and the calculated phase currents to detect a first fault transient in the distribution grid.

* * * * *